(12) United States Patent
Igeta et al.

(10) Patent No.: US 10,847,433 B2
(45) Date of Patent: Nov. 24, 2020

(54) APPARATUSES AND METHODS FOR COUPLING CONTACT PADS TO A CIRCUIT IN A SEMICONDUCTOR DEVICE

(71) Applicant: MICRON TECHNOLOGY, INC., Boise, ID (US)

(72) Inventors: Masahiko Igeta, Kawasaki (JP); Yoshimi Terui, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/507,989

(22) Filed: Jul. 10, 2019

(65) Prior Publication Data

US 2019/0333830 A1 Oct. 31, 2019

Related U.S. Application Data

(63) Continuation of application No. 15/944,497, filed on Apr. 3, 2018, now Pat. No. 10,410,938.

(51) Int. Cl.
| | |
|---|---|
| *H01L 21/66* | (2006.01) |
| *H01L 23/00* | (2006.01) |
| *H01L 23/522* | (2006.01) |
| *G01R 31/28* | (2006.01) |
| *H01L 27/088* | (2006.01) |

(52) U.S. Cl.
CPC .............. *H01L 22/34* (2013.01); *H01L 22/32* (2013.01); *H01L 23/5222* (2013.01); *H01L 24/06* (2013.01); *G01R 31/2831* (2013.01); *G01R 31/2884* (2013.01); *G01R 31/2886* (2013.01); *H01L 27/088* (2013.01); *H01L 2224/48247* (2013.01)

(58) Field of Classification Search
CPC ................................ H01L 22/32; H01L 22/34
See application file for complete search history.

(56) References Cited

U.S. PATENT DOCUMENTS

| | | | |
|---|---|---|---|
| 5,859,442 A | 1/1999 | Manning | |
| 6,114,878 A | 9/2000 | Loughmiller et al. | |
| 7,026,646 B2 * | 4/2006 | Cowles | G01R 31/2884 257/203 |
| 2008/0099857 A1 * | 5/2008 | Furuta | H01L 27/0705 257/401 |
| 2011/0199126 A1 * | 8/2011 | Onda | H01L 27/105 327/80 |
| 2014/0193956 A1 | 7/2014 | Xiao | |

* cited by examiner

*Primary Examiner* — Grant S Withers
(74) *Attorney, Agent, or Firm* — Dorsey & Whitney LLP

(57) ABSTRACT

Apparatuses and methods for coupling contact pads to a circuit in a semiconductor device is described. An example apparatus includes a first pad, a first wiring coupled to the first pad, a second pad, a second wiring, a circuit coupled to the second pad, and a switch circuit. The switch circuit includes first, second, and third connections, and includes first and second control gates. The first wiring is coupled to the first and third connections and second wiring is coupled to the second connection. The switch circuit is configured to couple the first wiring with the second wiring when the first and second control gates are activated and to decouple the first wiring from the second wiring when the first and second control gates are not activated.

20 Claims, 10 Drawing Sheets

APPARATUSES AND METHODS FOR COUPLING CONTACT PADS TO A CIRCUIT IN A SEMICONDUCTOR DEVICE

CROSS REFERENCE TO RELATED APPLICATION(S)

This application is a continuation of U.S. patent application Ser. No. 15/944,497, filed Apr. 3, 2018, issued as U.S. Pat. No. 10,410,938 on Sep. 10, 2019. The aforementioned application and patent are incorporated herein by reference, in their entireties for any purpose.

BACKGROUND

Processed semiconductor wafers typically comprise an array of substantially isolated integrated circuitry locations, which are subsequently separated to form semiconductor dies (or chips). In order to test the operability of the integrated circuitry of a die location on a wafer, a wafer probe card is applied to each die location. The wafer probe card includes a series of probe pins that are placed in electrical connection with a die location's bonding pads, which in turn connect to the die location's circuitry. The probe pins apply voltages to the input bonding pads and measure the resulting output electrical signals from the output bonding pads. After testing, the individual semiconductor dies are separated from one another, followed by packaging with bonding or connecting bonding wires to the respective bonding pads. If the wafer probe card's pins are in physical contact with the respective bonding pads, the bonding pads will be subject to scratches that may deteriorate the reliability of bonding/connection between each bonding pad and bonding wire. Therefore, the so-called probe pads are provided as accessible redundant contact pads electrically coupled to the bonding pads.

An additional hardware limitation relevant to testing the die locations is the spacing between the probe pins of the wafer probe card. Specifically, the probe pins may be spaced further apart than the bonding pads in a particular area of a die location. As a result, one bonding pad in that area may not be serviceable by a probe pin. As a solution, prior art teaches providing a probe pad in another area of the die location that can be reached by a probe pin. This, redundant probe pad is connected to the same logic circuit as the unserviceable bonding pad.

There may also be other reasons for including additional probe pads on a die. Regardless of the reasons, prior art allows these redundant probe pads to remain connected to the logic circuit after they are no longer needed. By remaining connected, these redundant probe pads contribute additional capacitance to their associated logic circuits and thereby degrade performance of the die.

DETAILED DESCRIPTION

Certain details are set forth below to provide a sufficient understanding of examples of the disclosure. However, it will be clear to one having skill in the art that examples of the disclosure may be practiced without these particular details. Moreover, the particular embodiments of the disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
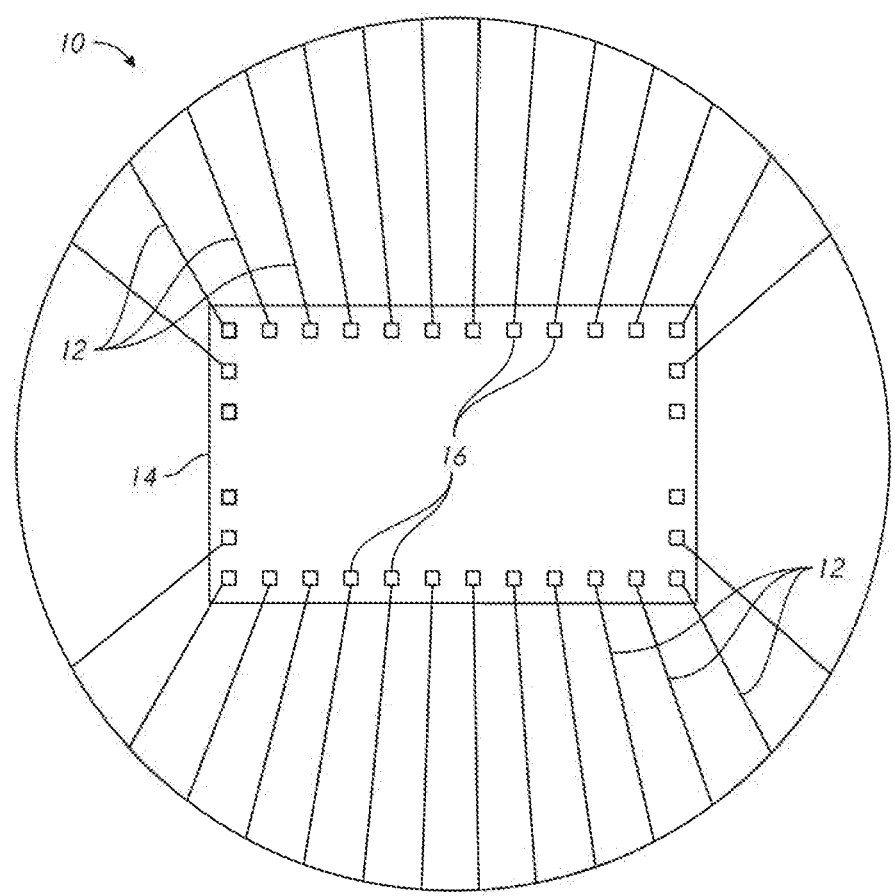
FIG. 1 is a diagram of a wafer probe card having a series of probe pins extending from two sides of the wafer probe card.

FIG. 1 is a diagram of a wafer probe card 10 having a series of probe pins 12 extending from two sides of the wafer probe card 10. In order to test a particular semiconductor device (or die) 14 of a wafer, this wafer probe card 10 is placed over the semiconductor device 14. The semiconductor device 14 includes a plurality of bonding pads 16. For purposes of this application, a contact pad is defined to include any conductive surface configured to permit temporary or permanent electrical communication with a circuit or node. During testing, the probe pins 12 of the wafer probe card 10 may be in communication with nearby bonding pads 16. In order to prevent each bonding pad 16 from subjecting to scratch due to the physical contact with the probe pin, redundant contact pads, such as a probe pads, are included in the semiconductor device 14 and each electrically connected to a corresponding one of the bonding pads. The probe pins 12 of the probe card are thus in physical contact with the probe pads instead of bonding pads.

Figure 2:
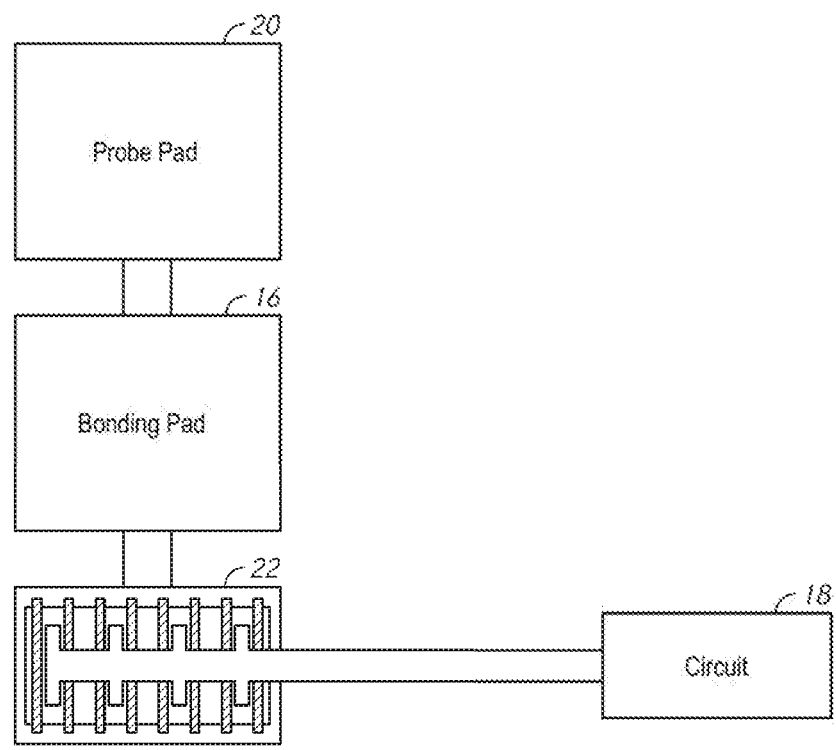
FIG. 2 is a diagram of a conventional arrangement of contact pads for a circuit.

FIG. 2 is a diagram of a conventional arrangement of contact pads for a circuit. A probe pad 20 and bonding pad 16 are coupled together, and further coupled to an internal circuit 18 through a protection circuit 22. The probe pad 20 provides an alternative coupling to the circuit 18, and may be used, for example, during testing. The bonding pad 16 may be used for coupling to, for example, a device terminal, another contact pad, etc. The bonding pad 16 is typically used during normal operation. The circuit 18 may represent various circuits, for example, input receiver circuits, logic circuits, etc. The protection circuit 22 is disposed between the bonding pad 16 and the circuit 18 to protect the circuit 18 from being damaged by unexpected electrical events at the probe pad 20 or bonding pad 16. Examples of unexpected electrical events include an electrostatic discharge, sudden electrical impulses, etc. During normal operation, signals provided to the bonding pad 16 are provided through the protection circuit 22 to the circuit 18. However, when an unexpected electrical event occurs, the protection circuit 22 prevents any high impulse electrical charge from reaching and damaging the circuit 18.

The probe pad 20 may facilitate coupling to the circuit 18, such as during testing. However, during normal operation the probe pad 20 is not used but adds capacitance to the input of the circuit 18. The added capacitance may degrade performance of the circuit 18.

Figure 3:
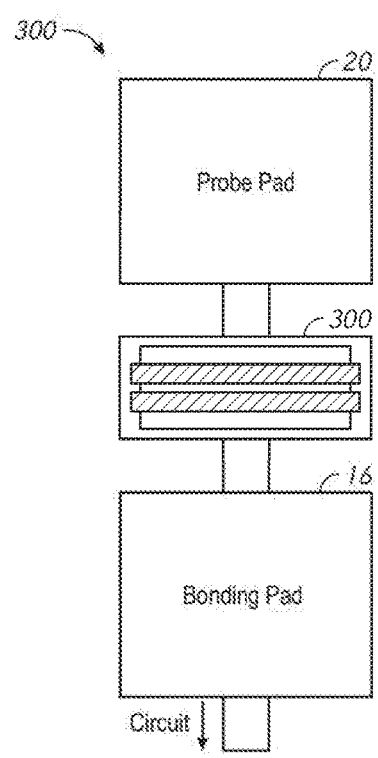
FIG. 3 is a diagram of an arrangement of contact pads for a circuit according to an embodiment of the disclosure.

FIG. 3 is a diagram of an arrangement of contact pads for a circuit according to an embodiment of the disclosure. FIG. 3 illustrates a probe pad 20 and a bonding pad 16 coupled together through a switch circuit 300. Although not shown in FIG. 3, an internal circuit may be coupled to the bonding pad 16 (and to the probe pad 20 through the switch circuit 300) through a protection Circuit.

The switch circuit 300 provides an electrical path between the probe pad 20 and the bonding pad 16, when the probe pad 20 is to be used, for example, during testing. The internal circuit is thus coupled to both the bonding pad 16 and the probe pad 20. The switch circuit 300 further decouples the probe pad 20 from the bonding pad 16 and from the internal circuit when the probe pad 20 is not used, for example, during normal operation. By decoupling the probe pad 20 from the bonding pad 16 and from the circuit when not used, capacitance may be reduced when providing an input to the circuit through bonding pad 16 compared to continually having the probe pad coupled to the bonding pad 16 and the circuit.

Figure 4:
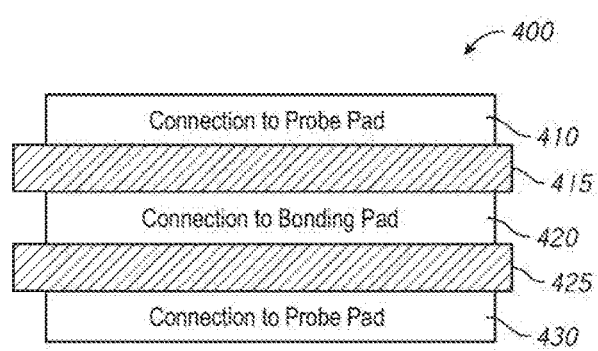
FIG. 4 is a diagram of a switch circuit according to an embodiment of the disclosure.

FIG. 4 is a diagram of a switch circuit 400 according to an embodiment of the disclosure. The switch circuit 400 may be included in the switch circuit 300 of FIG. 3 in some embodiments of the disclosure.

The switch circuit 400 includes connection 410, connection 420, and connection 430. The switch circuit 400 further includes control gates 415 and 425 that are used to control coupling and decoupling through the switch circuit 400. The control gate 415 is disposed between connection 410 and connection 420 and extends along a first direction (e.g., x-direction as shown in FIG. 4) between connection 410 and connection 420. The connection 410 and the connection 420 are on opposite sides of the control gate 415 in a second direction (e.g., y-direction as shown in FIG. 4). Similarly, the control gate 425 is disposed between connection 420 and connection 430 and extends along the first direction (e.g., x-direction as shown in FIG. 4) between connection 420 and connection 430. The connection 420 and the connection 430 are on opposite sides of the control gate 425 in the second direction (e.g., y-direction as shown in FIG. 4).

The connections 410, 420, and 430 may include conductive regions in some embodiments of the disclosure. For example, the connections 410, 420, and 430 may be diffusion regions, implant regions, or combinations thereof including dopants to provide conductivity. In some embodiments, the connections 410, 420, and 430 are included in a common diffusion region. The control gates 415 and 425 may include gate regions in some embodiments of the disclosure. The control gates 415 and 425 may include silicon, polysilicon, metal, or combinations thereof. In some embodiments of the disclosure, the connections 410, 420, and 430, and the control gates 415 and 425 may be included in one or more transistors. For example, in some embodiments of the disclosure, the connections 410, 420, and 430 represent source/drain regions and the control gates 415 and 425 represent gates of one or more field-effect transistors.

The control gate 415 controls coupling and decoupling between connections 410 and 420, and the control gate 425 controls coupling and decoupling between connections 420 and 430. For example, in some embodiments of the disclosure, connections 410 and 420 are coupled when the control gate 415 is activated and are decoupled when the control gate 415 is not activated, and connections 420 and 430 are coupled when the control gate 425 is activated and are decoupled when the control gate 425 is not activated. The control gate 415 may be activated by providing sufficient voltage to the gate 415 and the control gate 415 may be not activated by not providing sufficient voltage to the gate 415. Likewise, the control gate 425 may be activated by providing sufficient voltage to the gate 425 and the control gate 425 may be not activated by not providing sufficient voltage to the gate 425.

The voltage provided to the control gates 415 and 425 may be provided by one or more driver circuits that are controlled to provide voltage to activate the control gates 415 and 425 during use of the probe pad (e.g., during testing) and to not provide sufficient voltage to activate the control gates 415 and 425 when the probe pad is not used (e.g., during normal operation). Such one or more driver circuits may be included in the internal circuit.

In some embodiments of the disclosure, connections 410 and 430 may be coupled to a probe pad (e.g., probe pad 20 of FIGS. 2 and 3) and connection 420 may be coupled to a bonding pad (e.g., bonding pad 16 of FIGS. 2 and 3). Activating the control gate 415 and/or the control gate 425 may couple the probe pad to the bonding pad, and to a circuit coupled to the bonding pad.

In some embodiments, a probe pad coupled to the switch circuit 400 is disposed relative to the switch circuit in a direction perpendicular to a direction along which the control gates 415 and 425 extend. Likewise, a bonding pad coupled to the switch circuit 400 may be disposed relative to the switch circuit in a direction perpendicular to a direction along which the control gates 415 and 425 extend, and on an opposite side of the switch circuit 400 from the probe pad. For example, with reference to FIG. 4, the control gates 415 and 425 extend along the x-direction and a probe pad may be disposed relative to the switch circuit 400 in the y-direction and moreover, a bonding pad may also be disposed relative to the switch circuit 400 in the y-direction, but on an opposite side of the switch circuit 400 from the probe pad.

The switch circuit 400 may be used to provide an electrical path from a probe pad to a bonding pad, and to an internal circuit that may be coupled to the bonding pad, when the probe pad is to be used, for example, during testing. The switch circuit 400 further decouples the probe pad from the bonding pad and from the circuit when the probe pad is not used. By decoupling the probe pad from the bonding pad and from the circuit when not used, capacitance may be reduced when providing an input to the circuit through bonding pad compared to continually having the probe pad coupled to the bonding pad and the circuit.

In an example to illustrated capacitive reduction using the switch circuit, the connections 410, 420, and 430 are included in a common diffusion region. The common diffusion region has a length along the x-direction of 50 um and a width of 100 um along the y-direction, which results in a capacitance of 0.02 pF. It is further assumed that the capacitance of a probe pad is 0.05 pF. Although the diffusion region of the switch circuit may add capacitance to the bonding pad (as compared to a conventional arrangement of probe pad and a bonding pad that does not include a switch circuit according to an embodiment of the disclosure), the total capacitance reduction by decoupling the probe pad from a bonding pad using the switch circuit may be 0.03 pF. Where input resistance may be higher (e.g., increased from 30 ohms to 60 ohms), dimensions of the common diffusion region may be modified (e.g., reduced) to reduce the capacitance of the common diffusion region (e.g., reduced from 0.02 pF to 0.01 pF). As a result, overall capacitance may be further reduced by using the switch circuit.

Figure 5:
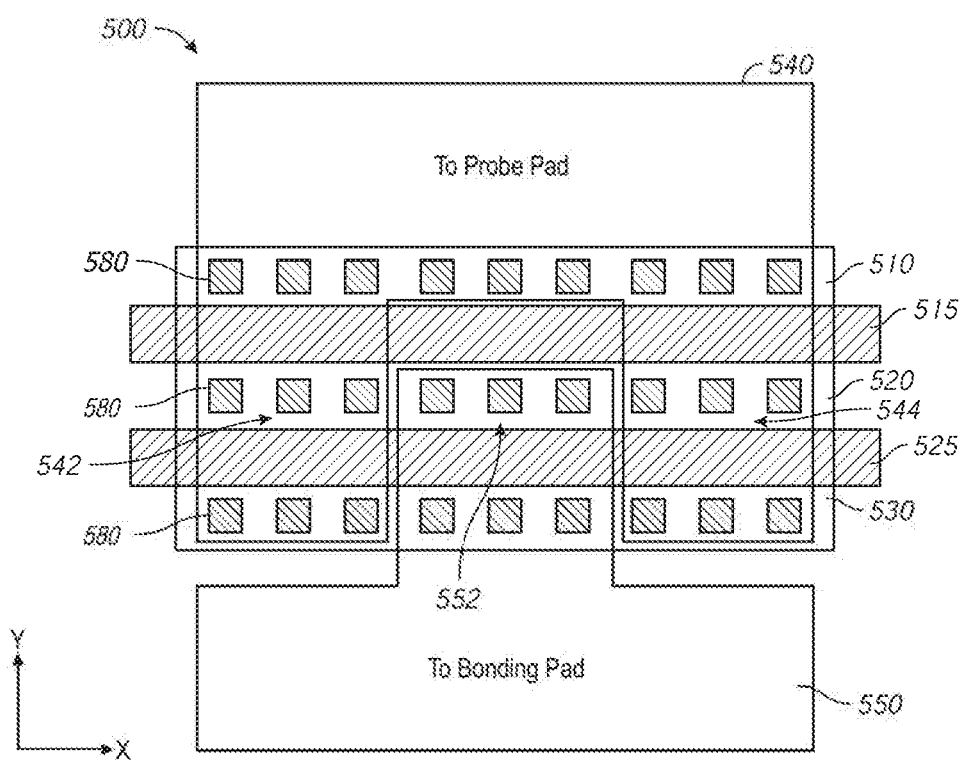
FIG. 5 is a diagram of a switch circuit according to an embodiment of the disclosure.

FIG. 5 is a diagram of a switch circuit 500 according to an embodiment of the disclosure. The switch circuit 500 may be included in the switch circuits 300 and 400 of FIGS. 3 and 4 in some embodiments of the disclosure.

The switch circuit 500 includes connection 510, connection 520, and connection 530. The switch circuit 500 further includes control gates 515 and 525 that are used to control coupling and decoupling through the switch circuit 500. The control gate 515 is disposed between connection 510 and connection 520 and extends along a first direction (e.g., x-direction as shown in FIG. 5) between connection 510 and connection 520. The connection 510 and the connection 520 are on opposite sides of the control gate 515 in a second direction (e.g., y-direction as shown in FIG. 5). Similarly, the control gate 525 is disposed between connection 520 and connection 530 and extends along the first direction between connection 520 and connection 530. The connection 520 and the connection 530 are on opposite sides of the control gate 525 in the second direction.

The connections 510, 520, and 530 may include conductive regions in some embodiments of the disclosure. For example, the connections 510, 520, and 530 may be diffusion regions, implant regions, or combinations thereof including dopants to provide conductivity. In some embodiments, the connections 510, 520, and 530 are included in a common diffusion region. The control gates 515 and 525 may include gate regions in some embodiments of the disclosure. The control gates 515 and 525 may include silicon, polysilicon, metal, or combinations thereof. In some embodiments of the disclosure, the connections 510, 520, and 530, and the control gates 545 and 525 may be included in one or more transistors. For example, in some embodiments of the disclosure, the connections 510, 520, and 530 represent source/drain regions and the control gates 515 and 525 represent gates of one or more field-effect transistors.

A connector 540 is coupled to connections 510, 520, and 530 through conductors 580. For example, in some embodiments of the disclosure, the connector 540 includes a portion 542 that extends to the connections 520 and 530 and further includes a portion 544 that also extends to the connections 520 and 530. The portions 542 and 544 may extend in the second direction from a portion of the connector 540 coupled to the connection 510. The portions 542 and 544 may be displaced from each other in the first direction. The portions 542 and 544 may extend over portions of the control gates 515 and 525.

A connector 550 is coupled to connections 520 and 530 through conductors 580. For example, in some embodiments of the disclosure, the connector 550 includes a portion 552 that extends to the connections 520 and 530. The portion 552 may extend in the second direction from a portion of the connector 550 coupled to the connection 530. In some embodiments of the disclosure, the portion 552 of the connector 550 may be disposed between the portions 542 and 544 of the connector 540. The portion 552 may extend over portions of the control gate 525, but not over portions of the control gate 515.

The connectors 540 and 550 are not coupled together except through the connections 510, 520, and 530 when control gates 515 and/or 525 are activated. The connectors 540 and 550 may include conductive materials. For example in some embodiments of the disclosure, the connectors 540 and 550 may include silicon, doped silicon, metal, combinations thereof, etc. The conductors 580 may be conductive vias, which may include, for example, silicon, doped silicon, metal, combinations thereof, etc.

The control gate 515 controls coupling and decoupling between connections 510 and 520, and the control gate 525 controls coupling and decoupling between connections 520 and 530. For example, in some embodiments of the disclosure, connections 510 and 520 are coupled when the control gate 515 is activated and are decoupled when the control gate 515 is not activated, and connections 520 and 530 are coupled when the control gate 525 is activated and are decoupled when the control gate 525 is not activated. The control gate 515 may be activated by providing sufficient voltage to the gate 515 and the control gate 515 may be not activated by not providing sufficient voltage to the gate 515. Likewise, the control gate 525 may be activated by providing sufficient voltage to the control gate 525 and the control gate 525 may be not activated by not providing sufficient voltage to the control gate 525.

The voltage provided to the control gates 515 and 525 may be provided by one or more driver circuits that are controlled to provide voltage to activate the control gates 515 and 525 during use of the probe pad (e.g., during testing) and to not provide sufficient voltage to activate the control gates 515 and 525 when the probe pad is not used (e.g., during normal operation).

In some embodiments of the disclosure, connector 540 may be coupled to a probe pad (e.g., probe pad 20 of FIGS. 2 and 3) and connector 550 may be coupled to a bonding pad (e.g., bonding pad 16 of FIGS. 2 and 3). In some embodiments of the disclosure, connector 540 may be included to a wiring coupled to a probe pad and connector 550 may be coupled to a wiring coupled to a bonding pad. Activating the control gate 515 and/or the control gate 525 may couple the probe pad to the bonding pad, and to a circuit coupled to the bonding pad.

Figure 6:
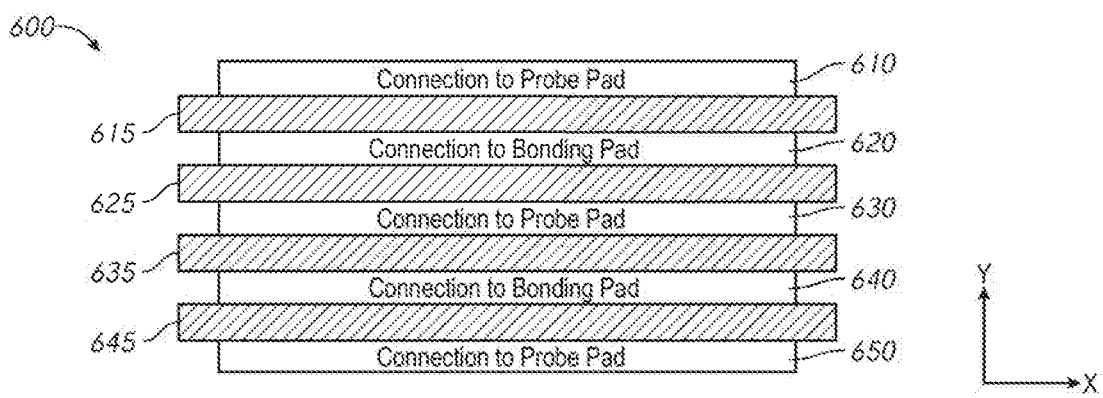
FIG. 6 is a diagram of a switch circuit according to an embodiment of the disclosure.

FIG. 6 is a diagram of a switch circuit 600 according to an embodiment of the disclosure. The switch circuit 600 may be included in the switch circuit 300 of FIG. 3 in some embodiments of the disclosure.

The switch circuit 600 includes connection 610, connection 620, connection 630, connection 640, and connection 650. The switch circuit 600 further includes control gates 615, 625, 635, and 645 that are used to control coupling and decoupling through the switch circuit 600. The control gate 615 is disposed between connection 610 and connection 620 and extends along a first direction (e.g., x-direction as shown in FIG. 6) between connection 610 and connection 620. The control gate 625 is disposed between connection 620 and connection 630 and extends along the first direction between connection 620 and connection 630. The control gate 635 is disposed between connection 630 and connection 640 and extends along the first direction between connection 630 and connection 640. The control gate 645 is disposed between connection 640 and connection 650 and extends along the first direction between connection 640 and connection 650.

The connection 610 and the connection 620 are on opposite sides of the control gate 615 in a second direction (e.g., y-direction as shown in FIG. 6). The connection 620 and the connection 630 are on opposite sides of the control gate 625 in the second direction. The connection 630 and the connection 640 are on opposite sides of the control gate 635 in the second direction. The connection 640 and the connection 650 are on opposite sides of the control gate 645 in the second direction.

The connections 610, 620, 630, 640, and 650 may include conductive regions in some embodiments of the disclosure. For example, the connections 610, 620, 630, 640, and 650 may be diffusion regions, implant regions, or combinations thereof including dopants to provide conductivity. In some embodiments, the connections 610, 620, 630, 640, and 650 are included in a common diffusion region. The control gates 615, 625, 635, and 645 may include gate regions in some embodiments of the disclosure. The control gates 615, 625, 635, and 645 may include silicon, polysilicon, metal, or combinations thereof. In some embodiments of the disclosure, the connections 610, 620, 630, 640, and 650, and the control gates 615, 625, 635, and 645 may be included in one or more transistors. For example, in some embodiments of the disclosure, the connections 610, 620, 630, 640, and 650 represent source/drain regions and the control gates 615, 625, 635, and 645 represent gates of one or more field-effect transistors.

The control gate 615 controls coupling and decoupling between connections 610 and 620, the control gate 625 controls coupling and decoupling between connections 620 and 630, the control gate 635 controls coupling and decoupling between connections 630 and 640, and the control gate 645 controls coupling and decoupling between connections 640 and 650. For example, in some embodiments of the disclosure, connections 610 and 620 are coupled when the control gate 615 is activated and are decoupled when the control gate 615 is not activated, and connections 620 and 630 are coupled when the control gate 625 is activated and are decoupled when the control gate 615 is not activated. Connections 630 and 640, and connections 640 and 650 may be coupled and decoupled in the same manner using control gates 635 and 645, respectively.

The control gates 615, 625, 635, and 645 may be activated by providing sufficient voltage to the respective control gate, and the control gates 615, 625, 635, and 645 may be not activated by not providing sufficient voltage to the respective control gate.

The voltage provided to the control gates 615, 625, 635, and 645 may be provided by one or more driver circuits that are controlled to provide voltage to activate the control gates 615, 625, 635, and 645 during use of the probe pad (e.g., during testing) and to not provide sufficient voltage to activate the control gates 615, 625, 635, and 645 when the probe pad is not used (e.g., during normal operation).

In some embodiments of the disclosure, connections 610, 630, and 650 may be coupled to a probe pad (e.g., probe pad 20 of FIGS. 2 and 3) and connections 620 and 640 may be coupled to a bonding pad (e.g., bonding pad 16 of FIGS. 2 and 3). Activating the control gates 615, 625, 635, and/or 645 may couple the probe pad to the bonding pad, and to a circuit coupled to the bonding pad.

In some embodiments, a probe pad coupled to the switch circuit 600 is disposed relative to the switch circuit in a direction perpendicular to a direction along which the control gates 615, 625, 635, and 645 extend. Likewise, a bonding pad coupled to the switch circuit 600 may be disposed relative to the switch circuit in a direction perpendicular to a direction along which the control gates 615, 625, 635, and 645 extend, and on an opposite side of the switch circuit 600 from the probe pad. For example, with reference to FIG. 6, the control gates 615, 625, 635, and 645 extend along the x-direction and a probe pad may be disposed relative to the switch circuit 600 in the y-direction, and moreover, a bonding pad may also be disposed relative to the switch circuit 600 in the y-direction, but on an opposite side of the switch circuit 600 from the probe pad.

Although not shown in FIG. 6, connectors may be coupled to one or more of the connections 610, 620, 630, 640, and 650. For example, a first connector may be coupled through conductors to connections 610, 620, 630, 640, and/or 650, and a second connector may be coupled through conductors to connections 610, 620, 630, 640, and/or 650. Each of the connectors may have portions that extend over portions of one or more of the control gates 615, 625, 635, and 645. Additionally, portions of each of the connectors may be disposed between portions of the other connector(s). For example, connectors and conductors having portions that extend in the second direction and are displaced from each other in the first direction, and have portions that may be disposed between the portions of the other connector(s) have been previously described with reference to FIG. 5. Similar conductors may be used to couple to the connections 610, 620, 630, 640, and 650. The connectors to the connections of the switch circuit 600 as previously described may be included in respective wirings that may be coupled a respective bonding pad and/or to another wiring.

Switch circuit 600 is similar to the switch circuit 400 of FIG. 4. However, the switch circuit 600 includes greater number of connections and control gates compared to the switch circuit 400. The switch circuit 600 may have different dimensions than the switch circuit 400, and may be preferable in applications where space for a switch circuit is better suited for more connections and control gates.

Figure 7:
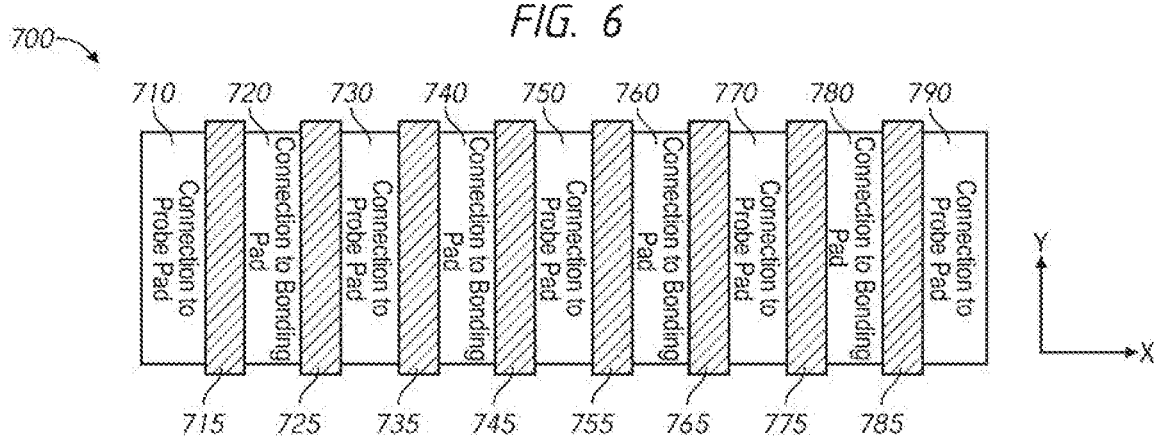
FIG. 7 is a diagram of a switch circuit according to an embodiment of the disclosure.

FIG. 7 is a diagram of a switch circuit 700 according to an embodiment of the disclosure. The switch circuit 700 may be included in the switch circuit 300 of FIG. 3 in some embodiments of the disclosure.

The switch circuit 700 includes connection 710, connection 720, connection 730, connection 740, connection 750 connection 760, connection 770, connection 780, and connection 790. The switch circuit 700 further includes control gates 715, 725, 735, 745, 755, 765, 775, and 785 that are used to control coupling and decoupling through the switch circuit 700. The control gate 715 is disposed between connection 710 and connection 720 and extends along a first direction (e.g., y-direction as shown in FIG. 7) between connection 710 and connection 720. The control gate 725 is disposed between connection 720 and connection 730 and extends along the first direction between connection 720 and connection 730. The control gate 735 is disposed between connection 730 and connection 740 and extends along the first direction between connection 730 and connection 740. Likewise, the control gates 745, 755, 765, 775, and 785 are disposed between connections 730, 740, 750, 760, 770, 780, and 790 in a similar manner.

The connection 710 and the connection 720 are on opposite sides of the control gate 715 in a second direction (e.g., x-direction as shown in FIG. 7). The connection 720 and the connection 730 are on opposite sides of the control gate 725 in the second direction. The connection 730 and the connection 740 are on opposite sides of the control gate 735 in the second direction. The connection 740 and the connection 750 are on opposite sides of the control gate 745 in the second direction. Likewise, the connections 760, 770, 780, and 790 and control gates 755, 765, 775, and 785 are arranged in a similar manner.

The connections 710, 720, 730, 740, 750, 760, 770, 780, and 790 may include conductive regions in some embodiments of the disclosure. For example, the connections 710, 720, 730, 740, 750, 760, 770, 780, and 790 may be diffusion regions, implant regions, or combinations thereof including dopants to provide conductivity. In some embodiments, the connections 710, 720, 730, 740, 750, 760, 770, 780, and 700 are included in a common diffusion region. The control gates 715, 725, 735, 745, 755, 765, 775, and 785 may include gate regions in some embodiments of the disclosure. The control gates 715, 725, 735, 745, 755, 765, 775, and 785 may include silicon, polysilicon, metal, or combinations thereof. In some embodiments of the disclosure, the connections 710, 720, 730, 740, 750, 760, 770, 780, and 790, and the control gates 715, 725, 735, 745, 755, 765, 775, and 785 may be included in one or more transistors. For example, in some embodiments of the disclosure, the connections 710, 720, 730, 740, 750, 760, 770, 780, and 790 represent source/drain regions and the control gates 715, 725, 735, 745, 755, 765, 775, and 785 represent gates of one or more field-effect transistors.

The control gate 715 controls coupling and decoupling between connections 710 and 720, the control gate 725 controls coupling and decoupling between connections 720 and 730, the control gate 735 controls coupling and decoupling between connections 730 and 740, and the control gate 745 controls coupling and decoupling between connections 740 and 750. For example, in some embodiments of the disclosure, connections 710 and 720 are coupled when the control gate 715 is activated and are decoupled when the control gate 715 is not activated, and connections 720 and 730 are coupled when the control gate 725 is activated and are decoupled when the control gate 715 is not activated. Connections 730 and 740, and connections 740 and 750 may be coupled and decoupled in the same manner using control gates 735 and 745, respectively. Likewise, coupling and decoupling of the connections 740, 750, 760, 770, 780, and 790 may be controlled in a similar manner with control gates 745, 755, 765, 775, and 785.

The control gates 715, 725, 735, 745, 755, 765, 775, and 785 may be activated by providing sufficient voltage to the respective control gate, and the control gates 715, 725, 735, 745, 755, 765, 775, and 785 may be not activated by not providing sufficient voltage to the respective control gate.

The voltage provided to the control gates 715, 725, 735, 745, 755, 765, 775, and 785 may be provided by one or more driver circuits that are controlled to provide voltage to activate the control gates 715, 725, 735, 745, 755, 765, 775, and 785 during use of the probe pad (e.g., during testing) and to not provide sufficient voltage to activate the control gates 715, 725, 735, 745, 755, 765, 775, and 785 when the probe pad is not used to (e.g., during normal operation).

In some embodiments of the disclosure, connections 710, 730, 750, 770, and 790 may be coupled to a probe pad (e.g., probe pad 20 of FIGS. 2 and 3) and connections 720, 740, 760, and 780 may be coupled to a bonding pad (e.g., bonding pad 16 of FIGS. 2 and 3). Activating the control gates 715, 725, 735, 745, 755, 765, 775, and/or, 785 may couple the probe pad to the bonding pad, and to a circuit coupled to the bonding pad.

In some embodiments, a probe pad coupled to the switch circuit 700 is disposed relative to the switch circuit in a same direction as the direction along which the control gates 715, 725, 735, 745, 755, 765, 775, and/or 785 extend. Likewise, a bonding pad coupled to the switch circuit 700 may be disposed relative to the switch circuit in a same direction as the direction alone which the control gates 715, 725, 735, 745, 755, 765, 775, and/or 785 extend, and on an opposite side of the switch circuit 700 from the probe pad. For example, with reference to FIG. 7, the control gates 715, 725, 735, 745, 755, 765, 775, and/or 785 extend along the y-direction and a probe pad may be disposed relative to the switch circuit 700 in the y-direction, and moreover, a bonding pad may also be disposed relative to the switch circuit 700 in the y-direction, but on an opposite side of the switch circuit 700 from the probe pad.

Although not shown in FIG. 7, connectors may be coupled to one or more of the connections 710, 720, 730, 740, 750, 760, 770, 780, and 790. For example, a first connector may be coupled through conductors to connections 710, 720, 730, 740, 750, 760, 770, 780, and/or 790, and a second connector may be coupled through conductors to connections 710, 720, 730, 740, 750, 760, 770, 780, and/or 790. Each of the connectors may have portions that extend over portions of one or more of the control gates 715, 725, 735, 745, 755, 765, 775, and/or 785. Additionally, portions of each of the connectors may be disposed between portions of the other connector(s). For example, connectors and conductors having portions that extend in the second direction and are displaced from each other in the first direction, and have portions that may be disposed between the portions of the other connector(s) have been previously described with reference to FIG. 5. Similar conductors may be used to couple to the connections 710, 720, 730, 740, 750, 760, 770, 780, and/or 790. The connectors to the connections of the switch circuit 700 as previously described may be included in respective wirings that may be coupled a respective bonding pad and/or to another wiring.

Switch circuit 700 is similar to the switch circuit 400 of FIG. 4. However, the switch circuit 700 includes a greater number of connections and control gates compared to the switch circuit 400. Additionally, the switch circuit 700 includes control gates extending in a direction different than control gates in the switch circuit 400 (e.g., in the y-direction for switch circuit 700 and in the x-direction for switch circuit 400). The switch circuit 700 may have different dimensions than the switch circuit 400, and may be preferable in applications where space for a switch circuit is better suited for more connections and control gates having the orientation of switch circuit 700.

As illustrated by the switch circuits 400, 500, 600, and 700, the arrangement of alternating connections and control gates may be increased, decreased, and oriented differently to provide a desirable switch circuit. Thus, the scope of the disclosure is not limited to the number of connections and control gates, or the orientation thereof of the particular examples described herein.

Figure 8:
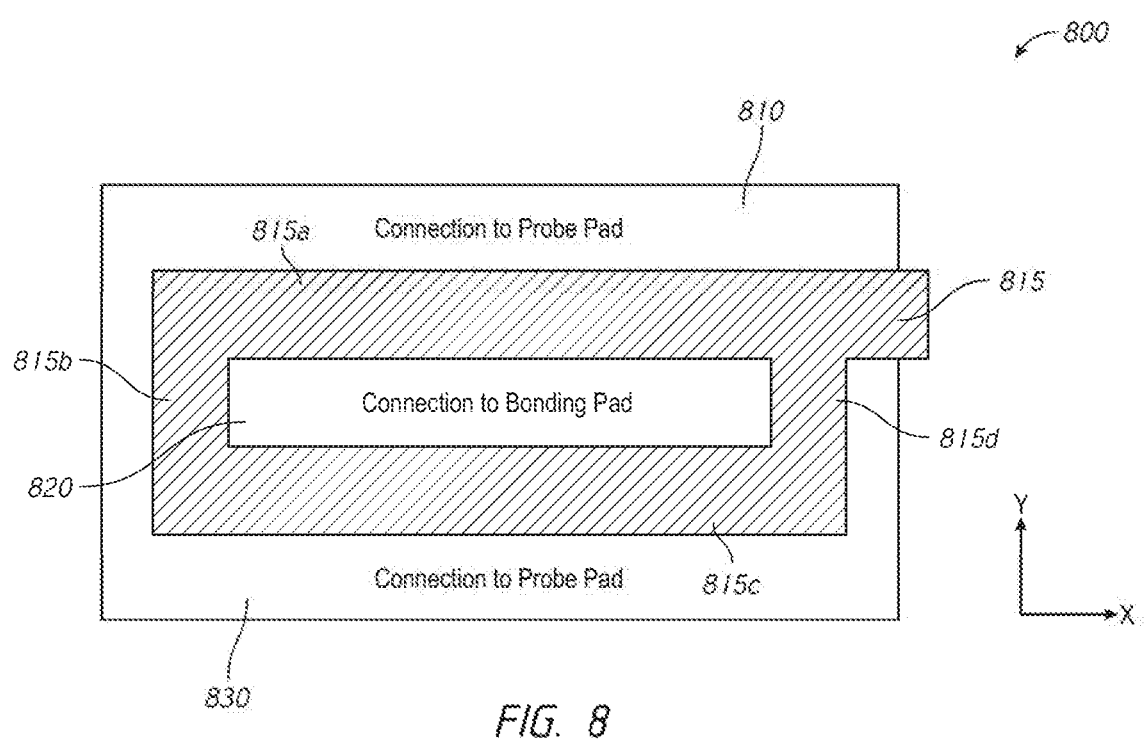
FIG. 8 is a diagram of a switch circuit according to an embodiment of the disclosure.

FIG. 8 is a diagram of a switch circuit 800 according to an embodiment of the disclosure. The switch circuit 800 may be included in the switch circuit 300 of FIG. 3 in some embodiments of the disclosure.

The switch circuit 800 includes connection 810, connection 820, and connection 830. The switch circuit 800 further includes control gate 815 that is used to control coupling and decoupling through the switch circuit 800. The control gate 815 is an enclosed control gate that surrounds the connection 820. The connection 810 and connection 830 may represent opposite sides of a continuous region that includes both connections 810 and 830. The connections 810, 820, and 830 may include conductive regions in some embodiments of the disclosure. For example, the connections 810, 820, and 830 may be diffusion regions, implant regions, or combinations thereof including dopants to provide conductivity. In some embodiments, the connections 810, 820, and 830 are included in a common diffusion region. The control gate 815 may include a gate region in some embodiments of the disclosure. The control gate 815 may include silicon, polysilicon, metal, or combinations thereof. In some embodiments of the disclosure, the connections 810, 820, and 830, and the control gates 815 may be included in one or more transistors. For example, in some embodiments of the disclosure, the connections 810, 820, and 830 represent source/drain regions and the control gate 815 represents a gate of one or more field-effect transistors.

As previously described, the control gate 815 controls coupling and decoupling between connections 810 and 830, and connection 820. For example, in some embodiments of the disclosure, connections 810 and 830 are coupled to connection 820 when the control gate 815 is activated and are decoupled when the control gate 815 is not activated. The control gate 815 may be activated by providing sufficient voltage to the gate 815 and the control gate 815 may be not activated by not providing sufficient voltage to the gate 815. The voltage provided to the control gate 815 may be provided by one or more driver circuits that are controlled to provide voltage to activate the control gate 815 during use of the probe pad (e.g., during testing) and to not provide sufficient voltage to activate the control gate 815 when the probe pad is not used (e.g., during normal operation).

In some embodiments, connections 810 and 830 may be coupled to a probe pad (e.g., probe pad 20 of FIGS. 2 and 3) and connection 820 may be coupled to a bonding pad (e.g., bonding pad 16 of FIGS. 2 and 3). Activating the control gate 815 may couple the probe pad to the bonding pad, and to a circuit coupled to the bonding pad.

Although not shown in FIG. 8, connectors may be coupled to one or more of the connections 810, 820, and 830. For example, a first connector may be coupled through conductors to connections 810, 820, and/or 830, and a second connector may be coupled through conductors to connections 810, 820, and/or 830. Each of the connectors may have portions that extend over portions of the control gate 815. Additionally, portions of each of the connectors may be disposed between portions of the other connector(s). For example, connectors and conductors having portions that extend in the second direction and are displaced from each other in the first direction, and have portions that may be disposed between the portions of the other connector(s) have been previously described with reference to FIG. 5. The connectors to the connections of the switch circuit 800 as previously described may be included in respective wirings that may be coupled a respective bonding pad and/or to another wiring.

In contrast to the switch circuits 400, 500, 600, and 700, the switch circuit 800 does not have a control gate that extends along one direction (e.g., along the x-direction or along the y-direction), but instead includes a control gate 815 having portions that extend along both a first or a second direction. For example, portions 815a and 815c of the control gate 815 extend along the x-direction, and portions 815b and 815d extend along the y-direction. Additionally, the control gate 815 of the switch circuit 800 has a ring structure. In FIG. 8 the control gate 815 is enclosed, having the connection 820 in the enclosed area. However, in some embodiments of the disclosure, the control gate 815 is not entirely enclosed, and thus, embodiments of the disclosure are not intended to be limited to the particular ring structure of control gate 815. More generally, embodiments of the disclosure include switch circuits having control gates of various shapes, and consequently, embodiments of the disclosure are not limited to switch circuits having a control gate that extends along one direction, or to a control gate that has a ring structure. Moreover, some embodiments of the disclosure have multiple control gates, but having different shapes.

The switch circuit 800 may have different dimensions than the switch circuits 400, 500, 600, and 700, and may be preferable in applications where space for a switch circuit is better suited for a ring shaped control gate.

Figure 9:
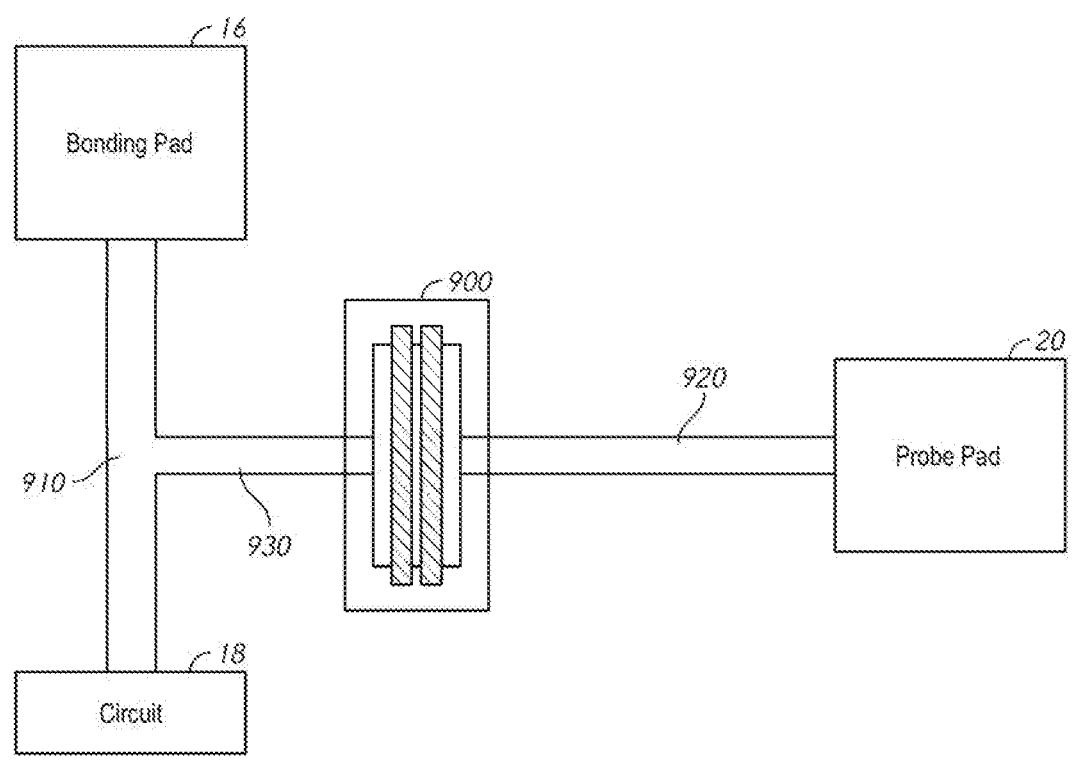
FIG. 9 is a diagram of an arrangement of contact pads for a circuit according to an embodiment of the disclosure.

FIG. 9 is a diagram of an arrangement of contact pads for a circuit according to an embodiment of the disclosure. FIG. 9 illustrates a bonding pad 16 coupled to a wiring 910 that is coupled to a circuit 18, and further illustrates a probe pad 20 coupled to a wiring 930 through wiring 920 and switch circuit 900. The wiring 930 is further coupled to the circuit 18 through the wiring 910. Although not shown in FIG. 9, a protection circuit 22 may be coupled between the wiring 910 and the circuit 18. As previously described with reference to FIG. 2, the protection circuit protects the circuit 18 from being damaged by unexpected electrical events at the probe pad 20 or bonding pad 16, for example, an electrostatic discharge, sudden electrical impulses, etc.

The wiring 920 may include a connector that is coupled to the switch circuit 900. Likewise, the wiring 930 may include a connector that is coupled to the switch circuit 900. For example, the wiring 920 and 930 may include respective connectors that are coupled to one or more connections of the switch circuit 900. In some embodiments of the disclosure, the connectors included in the wirings 920 and 930 may be similar to connectors that previously described with reference to FIG. 5. More generally, however, the wirings 910, 920, and 930 include portions that provide electrical connection to a switch circuit and/or to another wiring.

The wiring 910 and the wiring 930 are perpendicular to one another and the probe pad 20 disposed laterally from the bonding pad 16. In contrast to the arrangement of contact pads described with reference to FIG. 3, the switch circuit 900 is not disposed between the probe pad 20 and the bonding pad 16, but instead, the switch circuit 900 is disposed between the probe pad 20 and the wiring 910 that couples the bonding pad 16 to the circuit 18.

The switch circuit 900 provides an electrical path from the probe pad 20 to the circuit 18 when the probe pad 20 is to be used, for example, during testing. The switch circuit 900 further decouples the probe pad 20 from the circuit 18 when the probe pad 20 is not used. By decoupling the probe pad 20 from the bonding pad 16 and from the circuit 18 when not used, capacitance may be reduced when providing an input to the circuit 18 through bonding pad 16 compared to continually having the probe pad coupled to the bonding pad 16 and the circuit 18.

The switch circuit 900 may include switch circuit 400, 500, 600, 700, 800, or other switch circuits according to an embodiment of the disclosure. Whereas the switch circuits 400, 500, 600, 700 and 800 are described with having a connection coupled to the bonding pad (e.g., connection 420 for switch circuit 400; connection 520 and connection 530 of switch circuit 500; connections 620 and 640 for switch circuit 600; connections 720, 740, 760, and 780 for switch circuit 700), the connections are coupled to the wiring 910 and/or wiring 930.

Figure 10:
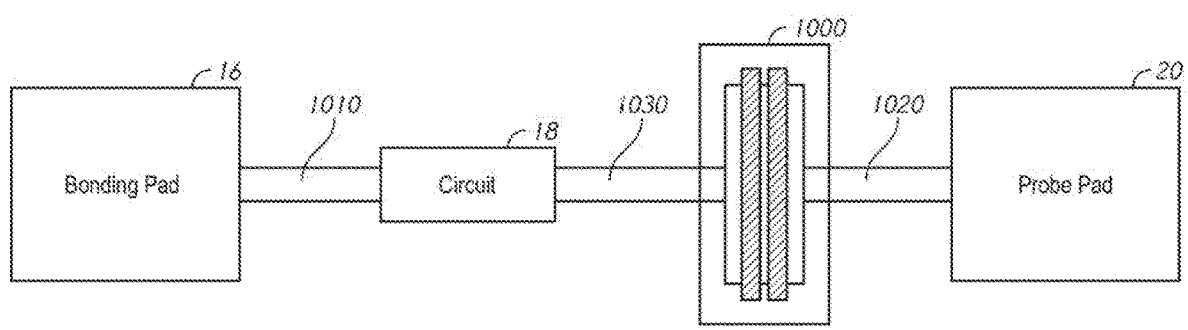
FIG. 10 is a diagram of an arrangement of contact pads for a circuit according to an embodiment of the disclosure.

FIG. 10 is a diagram of an arrangement of contact pads for a circuit according to an embodiment of the disclosure. FIG. 10 illustrates a bonding pad 16 coupled to a wiring 1010 that is coupled to a circuit 18, and further illustrates a probe pad 20 coupled to a wiring 1030 through wiring 1020 and switch circuit 1000. The wiring 1030 is further coupled to the circuit 18. Although not shown in FIG. 10, a protection circuit 22 may be coupled between the wiring 1010 and the circuit 18. As previously described with reference to FIG. 2, the protection circuit protects the circuit 18 from being damaged by unexpected electrical events at the probe pad 20 or bonding pad 16, for example, an electrostatic discharge, sudden electrical impulses, etc.

The wiring 1010 and the wiring 1030 are coupled to the circuit 18 on opposite sides of the circuit 18. The probe pad 20 is disposed on the opposite side of the circuit 18 from the bonding pad 16. However, embodiments of the disclosure are not limited to having the probe pad 20 disposed on the opposite side of the circuit 18 from the bonding pad 16. In contrast to the arrangement of contact pads described with reference to FIG. 3, the switch circuit 1000 is not disposed between the probe pad 20 and the bonding, pad 16, but instead, the switch circuit 1000 is disposed between the probe pad 20 and the circuit 18.

The switch circuit 1000 provides an electrical path from the probe pad 20 to the circuit 18 when the probe pad 20 is to be used, for example, during testing. The switch circuit 1000 further decouples the probe pad 20 from the circuit 18 when the probe pad 20 is not used. By decoupling the probe pad 20 from the bonding pad 16 and from the circuit 18 when not used, capacitance may be reduced when providing an input to the circuit 18 through bonding pad 16 compared to continually having the probe pad coupled to the bonding pad 16 and the circuit 18.

The switch circuit 1000 may include switch circuit 400, 500, 600, 700, 800, or other switch circuits according to an embodiment of the disclosure. Whereas the switch circuits 400, 500, 600, 700 and 800 are described with having a connection coupled to the bonding pad (e.g., connection 420 for switch circuit 400; connection 520 and connection 530 of switch circuit 500; connections 620 and 640 for switch circuit 600; connections 720, 740, 760, and 780 for switch circuit 700), the connections are coupled to the wiring 1020 and/or wiring 1030.

Figure 11:
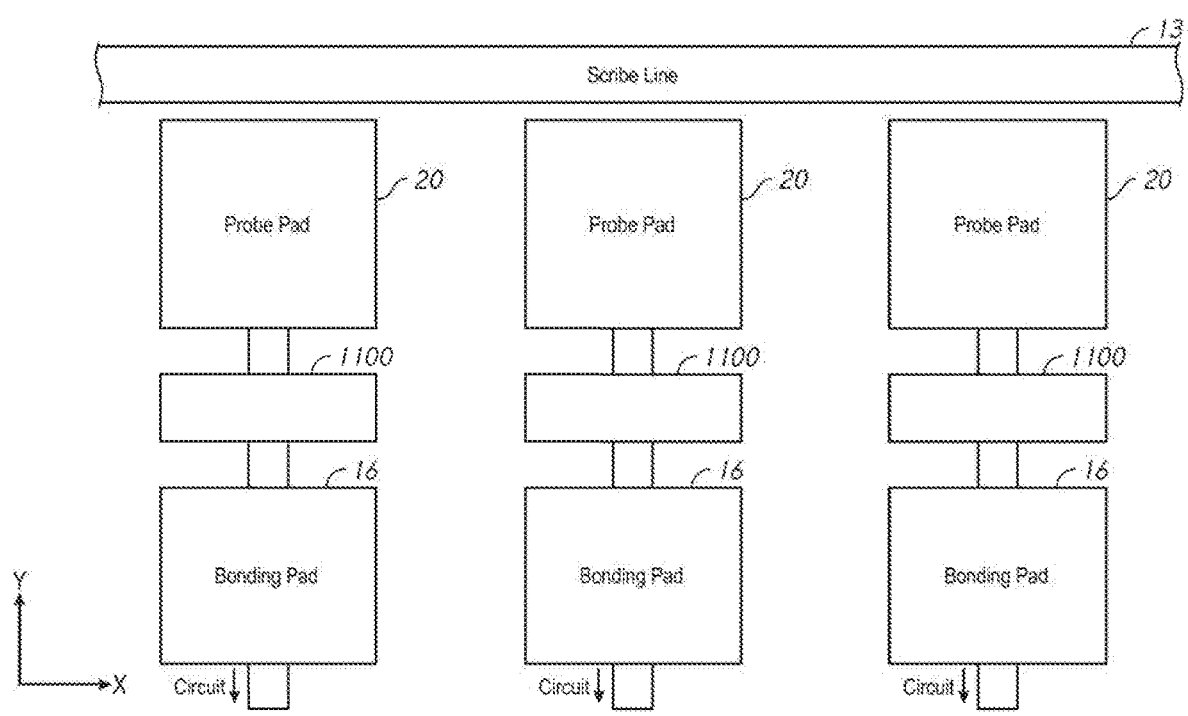
FIG. 11 is a diagram of an arrangement of probe pads and bonding pads on a semiconductor device according to an embodiment of the disclosure.

FIG. 11 is a diagram of an arrangement of probe pads and bonding pads on a semiconductor device according to an embodiment of the disclosure.

FIG. 11 illustrates probe pads 20 coupled to a respective one of bonding pads 16 through a respective switch circuit 1100 according to an embodiment of the disclosure. For example, the switch circuits 1100 may include the switch circuit 400, 500, 600, 700, 800, or other switch circuits according to an embodiment of the disclosure. Although not shown in FIG. 11, each pair of a probe pad 20 and a respective bonding pad 16 may be coupled to a respective circuit and protection circuit.

The probe pads 20 are arranged along a scribe line 13 of the semiconductor device. The scribe line 13 represents a border between adjacent semiconductor devices. Typically, a cutting device separates the semiconductor devices along the scribe lines.

The probe pads 20 and the bonding pads 16 provide coupling to the respective circuit. As previously described, the probe pads 20 provide an alternative coupling to the respective circuit 18, and may be used, for example, during testing. The bonding pads 16 may be used for coupling to, for example, a respective device terminal, another bonding pad, etc. The bonding pads 16 are typically used during normal operation. By arranging the probe pads 20 proximate the scribe line 13, the probe pads 20 allow for more convenient contact to the circuits of the semiconductor devices compared to the bonding pad. Each of the bonding pads 16 is arranged relative to a respective probe pad 20 along a direction perpendicular to a direction of the scribe line 13. For example, as illustrated in FIG. 11, each of the bonding pads 16 is disposed along a y-direction relative to the respective probe pad 20, whereas the direction of the scribe line 13 is along a x-direction.

As previously described, the switch circuit 1100 provides an electrical path from the probe pads 20 to the respective bonding pad 16, and to a circuit that may be coupled to the bonding pad 16, when the probe pad 20 is to be used, for example, during testing. The switch circuit 1100 further decouples the probe pad 20 from the respective bonding pad 16 and from the circuit when the probe pad 20 is not used. By decoupling the probe pad 20 from the respective bonding pad 16 and from the circuit when not used, capacitance may be reduced when providing an input to the circuit through bonding pad 16 compared to continually having the probe pad coupled to the bonding pad 16 and the circuit.

Figure 12:
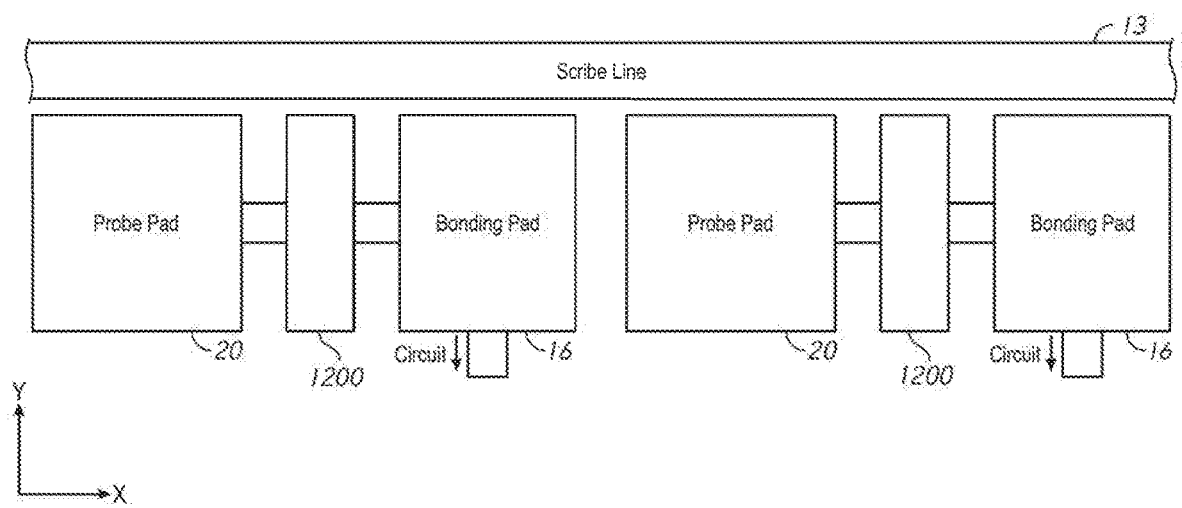
FIG. 12 is a diagram of an arrangement of probe pads and bonding pads on a semiconductor device according to an embodiment of the disclosure.

FIG. 12 is a diagram of an arrangement of probe pads and bonding pads on a semiconductor device according to an embodiment of the disclosure.

FIG. 12 illustrates probe pads 20 coupled to respective one of bonding pads 16 through a respective switch circuit 1200 according to an embodiment of the disclosure. For example, the switch circuits 1200 may include the switch circuit 400, 500, 600, 700, 800, or other switch circuits according to an embodiment of the disclosure. Although not shown in FIG. 12, each pair of a probe pad 20 and a respective bonding pad 16 may be coupled to a respective circuit and protection circuit.

The probe pads 20 and bonding pads 16 are arranged along a scribe line 13 of the semiconductor device. The scribe line 13 represents a border between adjacent semiconductor devices. Typically, a cutting device separates the semiconductor devices along the scribe lines.

The probe pads 20 and the bonding pads 16 provide coupling to the respective circuit. As previously described, the probe pads 20 provide an alternative coupling to the respective circuit 18, and may be used, for example, during testing. The bonding pads 16 may be used for coupling to, for example, a respective device terminal, another bonding pad, etc. The bonding pads 16 are typically used during normal operation. With the probe pads 20 proximate the scribe line 13, the probe pads 20 allow for more convenient contact to the circuits of the semiconductor devices compared to the bonding pad. In contrast to the arrangement of probe pads and bonding pads described with reference to FIG. 11, in FIG. 12 each of the bonding pads 16 is arranged relative to a respective probe pad 20 along a direction of the scribe line 13. For example, as illustrated in FIG. 12, each of the bonding pads 16 is disposed along a x-direction relative to the respective probe pad 20, which is also the direction of the scribe line 13.

As previously described, the switch circuit 1200 provides an electrical path from the probe pads 20 to the respective bonding pad 16, and to a circuit that may be coupled to the bonding pad, when the probe pad 20 is to be used, for example, during testing. The switch circuit 1200 further decouples the probe pad 20 from the respective bonding pad 16 and from the circuit when the probe pad 20 is not used. By decoupling the probe pad 20 from the respective bonding pad 16 and from the circuit when not used, capacitance may be reduced when providing an input to the circuit through bonding pad 16 compared to continually having the probe pad coupled to the bonding pad 16 and the circuit.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a first pad connecting to a circuit;
   a second pad;
   a first connector coupled to the first pad;
   a second connector coupled to the second pad; and
   a switch circuit disposed between the first and second pads in a first direction and configured to couple the first pad to the second pad when a control gate of the switch circuit is activated and further configured to decouple the first pad from the second pad when the control gate of the switch circuit is not activated;
   wherein the control gate of the switch circuit extends in a second direction perpendicular to the first direction; and
   wherein at least a first portion of the first connector extends in the first direction and at least a second portion of the second connector extends in the first direction to overlap with at least a portion of the first portion in the second direction.

2. The apparatus of claim 1, wherein the switch circuit comprises:
   a first connection coupled to the first connector; and
   a second connection coupled to the second connector;
   wherein the control gate of the switch circuit is disposed between the first and second connections and configured to couple the first connection to the second connection when activated and decouple the first connection from the second connection when deactivated.

3. The apparatus of claim 2, wherein the switch circuit further comprises:
   a third connection disposed between the first and second connections in the first direction; and
   an additional control gate disposed between the first and third connections in the first direction;
   wherein the control gate is disposed between the second and third connections in the first direction.

4. The apparatus of claim 3, wherein:
   the control gate is configured to couple the second connection to the third connection when activated and to decouple the second connection from the third connection when deactivated; and
   the additional control gate is configured to couple the first connection to the third connection when activated and to decouple the first connection from the third connection when deactivated.

5. The apparatus of claim 3, wherein the first portion of the first connector extends in the first direction from a portion of the first connector coupled to the first connection and further extends over a portion of the additional control gate.

6. The apparatus of claim 5, wherein the first portion does not extend over any portion of the control gate.

7. The apparatus of claim 3, wherein the second portion of the second connector extends in the first direction from a portion of the second connector coupled to the second connection and further extends over a portion of the control gate, over a portion of the third connection, over a portion of the additional control gate and to a portion of the third connection.

8. The apparatus of claim 1, wherein:
   the control gate is activated when the control gate is provided a voltage exceeding a threshold voltage; and
   the control gate is not activated when the control gate is provided a voltage not exceeding the threshold voltage.

9. An switch circuit comprising:
   a first connector connecting to a bonding pad, the first connector comprising a first portion and a second portion extending from the first portion of the first connector in a first direction;
   a second connector connecting to a probe pad, the second connector comprising a first portion, and second and third portions each extending from the first portion of the second connector in a second direction opposite the first direction; and
   a first control gate disposed between the first portion of the second connector and the first portion of the first connector and configured to provide coupling and decoupling of the first and second pads;
   wherein the second portion of the first connector is disposed between the second and third portions of the second connector.

10. The apparatus of claim 9 further comprising:
    a first connection coupled to the first connector; and
    a second connection coupled to the second connector;
    wherein the first control gate is disposed between the first connection and the second connection and configured to couple the first connection to the second connection when activated and decouple the first connection from the second connection when deactivated.

11. The apparatus of claim 10 further comprising:
    a third connection disposed between the first and second connections; and
    a second control gate disposed between the first and third connections;
    wherein the second and third connections are disposed on opposite sides of the first control gate.

12. The apparatus of claim 11, wherein the first and second control gates are configured to provide coupling and decoupling of the first and second connectors via activation and deactivation of the first and/or second control gates.

13. The apparatus of claim 11, wherein the second portion of the first connector extends over to the third connection and does not extend over to the first control gate.

14. A semiconductor die comprising:
    a circuit;
    a bonding pad coupled to the circuit;
    a probe pad;
    a switch circuit including a control gate disposed between a first connection coupled to the bonding pad and a second connection coupled to the probe pad, the switch circuit configured to couple the bonding pad to the probe pad by activating the control gate when the semiconductor die is operating in a test mode and further configured to decouple the bonding pad from the probe pad by deactivating the control gate when the semiconductor die is operating in a normal operation mode;
    wherein the first connection is enclosed in the control gate of the switch circuit.

15. The semiconductor die of claim 14, wherein the control gate is also enclosed in the second connection.

16. The semiconductor die of claim 15, wherein each of the first connection and the second connection comprises a source/drain of one or more transistors and the control gate of the switch circuit comprises a gate of the one or more transistors, where the control gate is configured to provide coupling and decoupling of the bonding pad and the probe pad through the coupling and decoupling of the first connection and the second connection, respectively.

17. The semiconductor die of claim 14, wherein the control gate extends in both a first direction and a second direction perpendicular to the first direction.

18. The semiconductor die of claim 17, wherein the control gate comprises a ring structure.

19. The semiconductor die of claim 14, wherein the switch circuit is configured to couple the bonding pad electrically to the probe pad in a first state corresponding to the test mode and decouple the first pad electrically from the second pad in a second state corresponding to the normal operation mode.

20. The semiconductor die of claim 14, wherein the control gate of the switch circuit forms an enclosed area, wherein the first connection is disposed in a center area of the enclosed area.

* * * * *